United States Patent
Miller (10) Patent No.: US 7,150,811 B2
(45) Date of Patent: Dec. 19, 2006

(54) ION BEAM FOR TARGET RECOVERY

(75) Inventor: Brian Miller, Portland, OR (US)

(73) Assignee: FEI Company, Hillsboro, OR (US)

( * ) Notice: Subject to any disclaimer, the term of this patent is extended or adjusted under 35 U.S.C. 154(b) by 268 days.

(21) Appl. No.: 10/669,616

(22) Filed: Sep. 24, 2003

(65) Prior Publication Data

US 2004/0099638 A1 May 27, 2004

Related U.S. Application Data

(60) Provisional application No. 60/429,135, filed on Nov. 26, 2002.

(51) Int. Cl.
C23C 14/34 (2006.01)
(52) U.S. Cl. .................. 204/192.34; 204/192.35; 204/192.37; 216/66; 216/94
(58) Field of Classification Search .......... 204/192.34, 204/192.35, 192.36, 192.37, 298.36; 216/66, 216/94
See application file for complete search history.

(56) References Cited

U.S. PATENT DOCUMENTS

| | | | |
|---|---|---|---|
| 3,860,783 A | 1/1975 | Schmidt et al. ...... 219/121 EM |
| 4,085,022 A | 4/1978 | Wechsung et al. ...... 204/192 E |
| 4,277,304 A | 7/1981 | Horiike et al. .............. 156/643 |
| 4,490,210 A | 12/1984 | Chen et al. .................. 156/643 |
| 4,975,141 A | 12/1990 | Greco et al. ................. 156/626 |
| 5,018,164 A | 5/1991 | Brewer et al. ............... 372/109 |
| 5,211,527 A | 5/1993 | Ahlsen et al. ............... 414/664 |
| 5,405,810 A | 4/1995 | Mizuno et al. ............. 437/229 |
| 5,456,756 A | 10/1995 | Ramaswami et al. ....... 118/721 |
| 5,483,037 A | 1/1996 | Mashburn .............. 219/121.68 |
| 5,643,472 A | 7/1997 | Engelsberg et al. ........... 216/65 |
| 5,738,961 A | 4/1998 | Chen ........................... 430/22 |
| 5,911,108 A | 6/1999 | Yen ............................. 438/401 |
| 5,912,186 A | 6/1999 | Yoshino et al. ............. 438/708 |
| 5,952,247 A | 9/1999 | Livengood et al. ......... 438/734 |
| 6,057,525 A | 5/2000 | Chang et al. .......... 219/121.73 |
| 6,083,841 A | 7/2000 | Yano et al. .................. 438/706 |
| 6,130,015 A | 10/2000 | Noddin et al. ................ 430/22 |
| 6,136,479 A | 10/2000 | Yamaguchi ..................... 430/5 |
| 6,261,918 B1 | 7/2001 | So ............................. 438/401 |
| 6,268,608 B1 | 7/2001 | Chandler ................. 250/492.2 |
| 6,277,659 B1 | 8/2001 | Goruganthu et al. .......... 438/14 |
| 6,281,471 B1 | 8/2001 | Smart ..................... 219/121.62 |
| 6,288,773 B1 | 9/2001 | Johnson et al. ................ 355/77 |
| 6,440,615 B1* | 8/2002 | Shimizu ......................... 430/5 |
| 6,552,301 B1 | 4/2003 | Herman et al. ......... 219/121.71 |
| 6,727,458 B1 | 4/2004 | Smart ..................... 219/121.62 |
| 2001/0027917 A1* | 10/2001 | Ferranti et al. ........ 204/192.11 |
| 2003/0138709 A1* | 7/2003 | Burbank et al. .............. 430/22 |

* cited by examiner

*Primary Examiner*—Rodney G. McDonald
(74) *Attorney, Agent, or Firm*—Michael O. Scheinberg; David Griner; Hilgers, Bell & Richards (57) ABSTRACT

A charged particle beam apparatus and method for locally removing material from a predetermined location on a workpiece, such as the removal of a metallization layer covering an alignment mark on a wafer. The invention is particularly suited for high-volume mass production of semiconductor chips or electromechanical devices. According to one embodiment of the invention, a layer of material covering an alignment mark on a wafer is removed by ion beam sputtering using a non-LMIS beam directed at an oblique angle to the sample surface.

22 Claims, 4 Drawing Sheets

ION BEAM FOR TARGET RECOVERY

This application claims priority from U.S. Provisional Patent Application No. 60/429,135, which was filed on Nov. 26, 2002 and is hereby incorporated by reference.

TECHNICAL FIELD OF THE INVENTION

The present invention relates to lithographic processing, and in particular to a method for locally removing any desired material from a predetermined location on a wafer, such as the portion of a metallization layer covering a wafer alignment mark.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips, electromechanical devices, or read write components in data storage drives.

Due to the extremely small tolerances of the optical system, an entire wafer is not exposed at once during projection printing. Instead, adjacent portions of the wafer are exposed sequentially. After a portion of the wafer is exposed, the optical system is moved to a next position by means of a motor drive and the next portion of the wafer is exposed. A photolithographic projection printer of this type is called a "stepping printer" or a "wafer stepper." Another exposure method involves the scanning of a line across the wafer while the wafer is moved continuously. A photolithographic projection printer of this type is called a "wafer scanner."

At each step, the alignment of the mask and the wafer must be carried out with high accuracy before exposure. To perform the alignment, the wafer has marks for position detection, commonly referred to as alignment marks, which are formed on a wafer in an early lithography process. Alignment marks typically consist of narrow bars or gratings oriented to provide x and y positioning information. The alignment mark is often printed in the kerf, the narrow space between chips on the wafer. Since many equipment manufacturers use different types of alignment marks at different locations, it is not uncommon for several different types of alignment marks to be formed on the same wafer.

During the masking process, the wafer stepper uses alignment marks to precisely align the mask with the desired portion of the wafer. Typically, a laser alignment beam is directed at an appropriate alignment mark. The wafer stepper "reads" the resulting diffraction pattern, and adjusts the relative positions of the wafer and the photolithographic mask so that the pattern for the photolithographic mask are transferred to the wafer in the precise location desired. The marks are usually read at each masking step so each subsequent mask is aligned to the same mark.

During the semiconductor manufacturing process, alignment marks can easily become contaminated or covered with various process materials. In such instances, it is necessary to clean the alignment marks on the wafer before any subsequent processing occurs to ensure proper alignment of the wafer on the process equipment.

For example, the manufacture of modem integrated circuit structures typically requires multiple metallization layers in order to achieve the desired density of circuit elements in the structure. These layers of metal film are typically opaque or highly reflective. As the surface of the wafer is covered with each successive metallization layer, the alignment marks are typically also covered and can no longer be read by the wafer stepper. Before any additional processing can occur, the alignment marks must be uncovered.

This process of uncovering or cleaning the alignment marks is commonly referred to as "target recovery," and is typically accomplished with an additional photolithography step. However, the additional mask and etch steps, plus the attendant cleaning and inspection steps, undesirably increase cycle time and process complexity. In fact, uncovering an alignment mark using a traditional photolithography process (spin, expose, develop, bake, etch, ash, clean) can delay continued processing of a wafer for up to 8 hours, and must be repeated with each additional occluding metallization layer.

One method of avoiding these additional photolithography steps is described in U.S. Pat. No. 5,456,756 to Ramaswami et al. for "Holding apparatus, a metal deposition system, and a wafer processing method which preserve topographical marks on a semiconductor wafer." In this system, shielding tabs on the clamp ring used to hold wafers in place during material deposition are used to shield the alignment marks during material deposition. This shielding prevents material from being deposited over the alignment marks and obscuring the alignment marks. Unfortunately, this method can cause a number of problems during the semiconductor manufacturing process, including delamination, uneven films, and wafer-edge peeling. These problems are especially significant in the context of mass production manufacturing of semiconductor chips.

Another approach is described in U.S. Pat. No. 5,405,810 to Mizuno et al. for "Alignment Method and Apparatus." Mizuno et al. describes the use of an energy beam and gas-assisted etching to remove a predetermined portion of a film covering an alignment mark. However, this method also suffers from several shortcomings that make it less suitable for mass production manufacturing. First, the use of gas assisted etching necessarily requires the use of a gas-delivery system. Any energy beam system with such a gas delivery system will be more complex than a system without a gas delivery system. Greater complexity tends to reduce the reliability of such a system and make it less suitable for use in mass production. A system that requires a gas delivery system will also tend to be physically larger than a system without a gas delivery system. Smaller systems are desirable because most manufacturing takes place in a clean room, and the cost of clean room space is extremely high. Further, the gases used in this type of system are typically toxic and/or corrosive, which causes difficulty in handling and storage. Such gases can also degrade the components in the vacuum system.

SUMMARY OF THE INVENTION

It is an object of the invention, therefore, to provide a method for locally removing any desired material from a predetermined location on a workpiece—such as the removal of a metallization layer covering an alignment mark on a wafer—in a manner suitable for high-volume mass production of semiconductor chips or electromechanical devices. A preferred embodiment of the invention described and claimed herein comprises the use of charged particle beam milling to uncover alignment marks.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and the advantages thereof, reference is now made to the following descriptions taken in conjunction with the accompanying drawings, in which.

DETAILED DESCRIPTION OF THE PREFERRED EMBODIMENTS

A preferred embodiment of the invention provides a method for locally removing any desired material from a predetermined location on a substrate, such as the portion of a metallization layer covering an alignment mark on a semiconductor wafer.

Figure 1A:
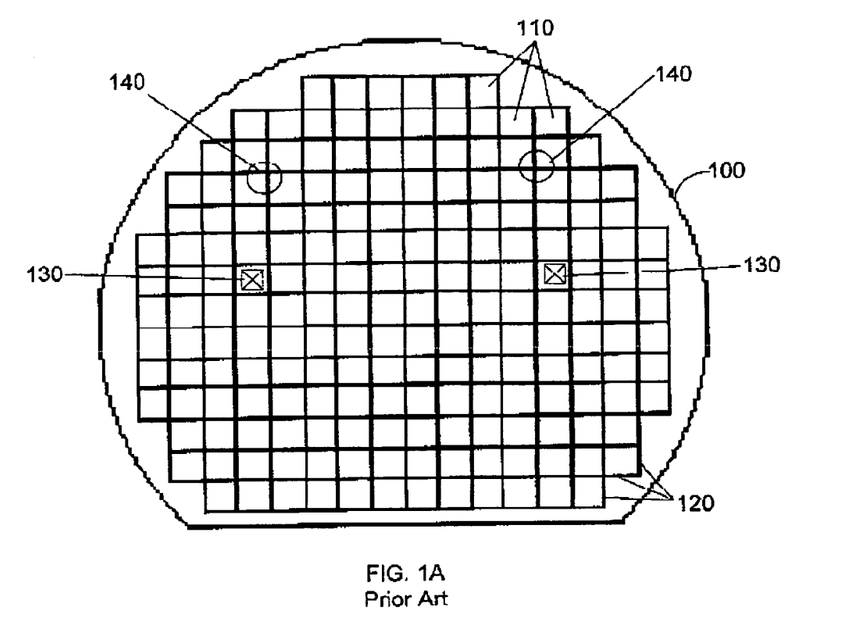
FIG. 1A is a top view of a prior art semiconductor wafer illustrating two common placement locations for alignment marks.

FIG. 1A is a top view of a semiconductor wafer illustrating two common placement locations for alignment marks. The wafer 100 comprises a plurality of dies 110 which are delineated on the wafer by scribe lines 120. Alignment marks 130 can be located within an unused die. Alignment marks 140 can also be located within the scribe lines 120. Typically, scribe lines 120 have a width of less than 200 microns.

Photolithographic tool manufacturers, including ASML, SVGL, Nikon, and Canon, each require unique alignment marks and/or locations for those alignment marks. In some cases a vendor may have different marks for each of their own different photolithography tools. As a result, it is sometimes necessary for a single semiconductor wafer to have several different alignment marks.

Figure 1B:
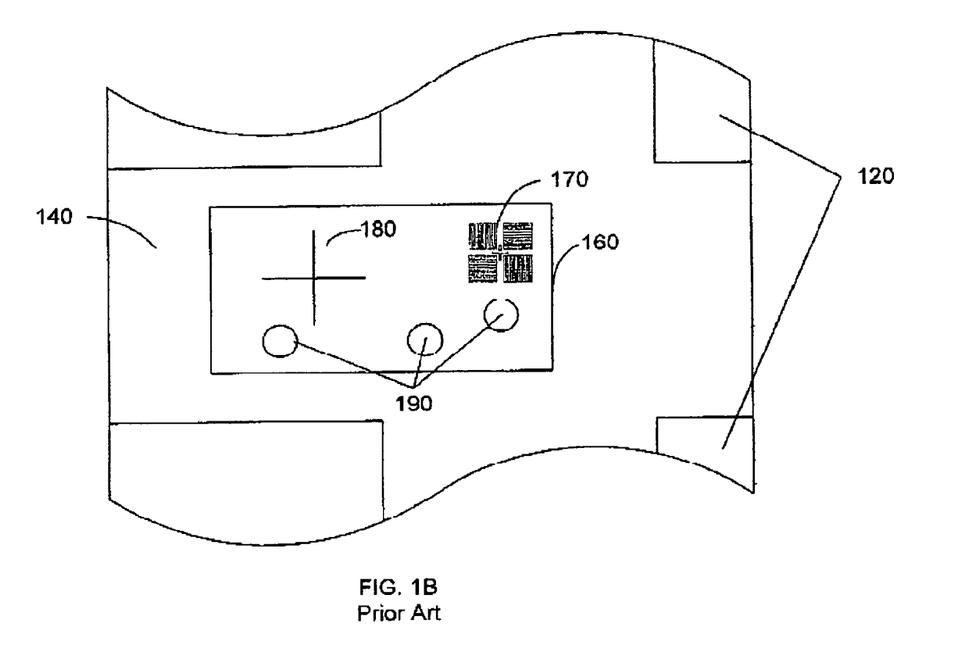
FIG. 1B illustrates a partial enlarged view of a prior art alignment mark box containing several different types of alignment marks.

FIG. 1B illustrates a partial enlarged view of wafer 100 and an alignment mark box 160 located within scribe line 120. Box 160 contains several different types of alignment marks 170, 180, and 190. Each of these different alignment marks could be used by a different tool in the manufacturing process.

Figure 2:
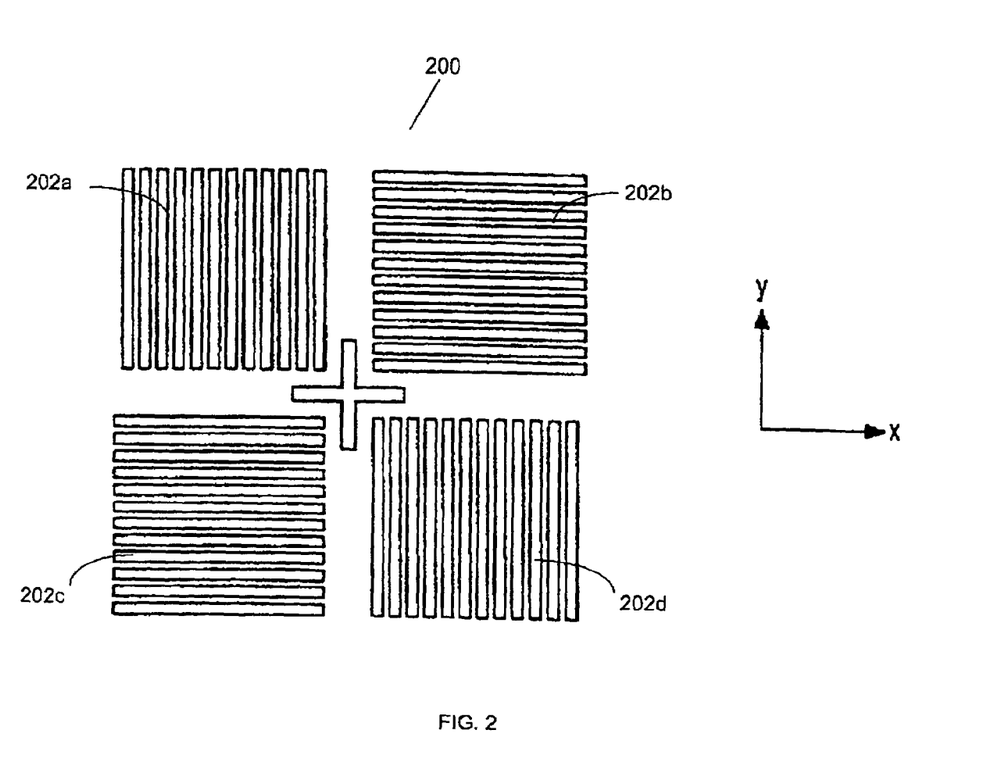
FIG. 2 shows a top view of a typical prior art alignment mark.

FIG. 2 shows a top view of a typical alignment mark 200. This alignment mark 200 comprises a two-dimensional grating and is similar to alignment marks used by ASML, a manufacturer of wafer steppers. This alignment mark further comprises four sub-gratings, 202a, 202b, 202c, and 202d. Sub-gratings 202a and 202d are used for alignment in the X direction, while 202b and 202c are used for alignment in the Y direction.

During the semiconductor manufacturing process, when alignment marks (such as those illustrated in FIGS. 1A, 1B, and 2) are covered with opaque or reflective metallization layers, the alignment marks must be uncovered before the manufacturing process can continue. This process of uncovering or cleaning the alignment marks is typically accomplished with additional photolithography steps. However, the additional mask and etch steps, plus the attendant cleaning and inspection steps, undesirably increase cycle time and process complexity. As shown in the table below, uncovering an alignment mark using a traditional photolithography process can delay further processing of a wafer up to 8 hours, while uncovering an alignment mark using the present invention may only take a total of approximately 0.25 hours.

Figure 3:
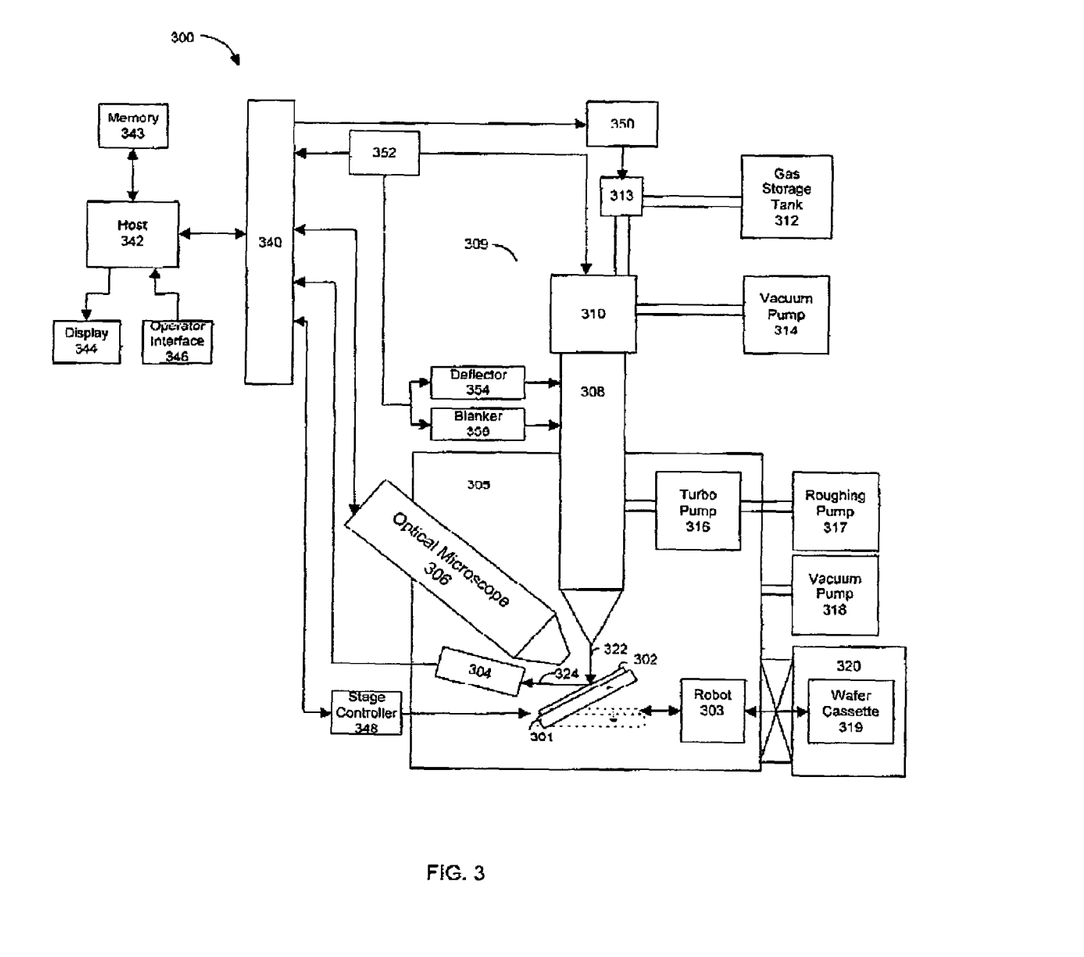
FIG. 3 shows schematically a preferred embodiment of the invention.

FIG. 3 depicts an embodiment of a system 300 of the present invention. The embodiment depicted in FIG. 3 comprises a charged particle beam system 309, a host computer 342, a display 344, an operator interface 346 (such as a keyboard and mouse), memory 343, and a host interface 340. In some embodiments, all or pan of the functionality of host computer 342 can be replaced with one or more embedded computers.

The workpiece 302, such as a semiconductor wafer where the alignment marks have been covered by a metallization layer, is mounted on stage 301 within vacuum chamber 305. Vacuum chamber 305 is evacuated by vacuum pump 318, typically to a pressure of less than $1 \times 10^{-4}$ mbar.

Skilled persons will recognize that the workpiece can be mounted manually or automatically, for example by an automatic handler system. System 300 can be one of a number of stations performing specific tasks in the semiconductor manufacturing process. A centralized robotic arm or other automated handling system can move wafers from one station to another station under the control of a "recipe" or computer program that defines the procedures a wafer has to undergo during the manufacturing process.

Optical microscope 306 can be used to align the workpiece 302 for determining the center of the wafer and orientation. For example, after the workpiece is in the chamber, at least three edges of a wafer can be located using the optical microscope to see the change in contrast between the wafer and no wafer. These edge locations are used to calculate the center of the wafer. The notch is then recognized and any rotation is calculated and accounted for. A machine vision system can be used instead of, or in addition to, the optical microscope. Optionally, workpiece 302 can be positioned by means of a robot 303. Such robots are common in the semiconductor manufacturing process. In a previous step, workpiece 302 can be loaded into a prealignment module (not shown) which determines the orientation of the wafer, for example, by locating a notch or flat edge of the wafer. Automatic handler robot 303 can remove workpiece 302 from the prealignment module and place it on stage 301 so that it is properly aligned.

Typically, workpiece 302 would be one of a batch of wafers, loaded in a wafer cassette 319 containing a number (e.g. 25 units) of wafers. The wafer cassette 319 and robot 303 can optionally be located inside vacuum chamber 305, or even in a secondary vacuum chamber 320. In order to be accessible to the robot 303, a cassette of wafers can loaded into a secondary vacuum chamber 320 which can then be sealed and lowered to the pressure of the main vacuum chamber 305. This reduces the need to bring the chamber up to atmospheric pressure each time a new cassette of wafers is inserted.

Charged particle beam system 309 includes the physical hardware of the beam system, including an ion optical column 308 and a detector 304 for generating a signal corresponding to a characteristic of the surface at each point to which the beam is directed. Ion optical column 308 includes lenses for focusing the beam (not shown), a beam deflector 354 for steering the beam, and a beam blanker 356 for interrupting the beam, all controlled via controller 352.

Ions are extracted from plasma ion source 310 and accelerated trough ion column 308 to produce an ion beam 322, which is used to mill the metallization layer covering the alignment marks. When a FIB system is used, the ion beam mills the surface by sputtering, that is, physically removing atoms and molecules from the specimen surface. Secondary electrons 324 can be collected by detector 304 to form an image of the specimen surface. The analog signals from detector 304 are converted into digital signals and subjected to signal processing by ion beam signal processing unit (not shown). The resulting digital signal can be used by host 342, in coordination with signals from beam deflector 354, to display an image of workpiece 301 on display 344.

In a preferred embodiment, ion column 308 is a noble gas column, which produces an ion beam consisting of non-reactive, high energy ions such as argon, krypton or xenon. This type of column allows a usable ion beam at a much higher beam current than a typical Gallium LMIS ion column. A Gallium LMIS ion column normally allows a maximum beam current of around 20 nanoamps (although higher beam currents can be used, the resulting ion beam will be of very poor quality). In contrast, a noble gas column can produce usable beam quality and current density at beam currents greater than 100 nanoamps. The use of a noble gas column also avoids real or perceived problems of metal contamination that may occur with a traditional Gallium ion beam.

The beam current used would preferably be from 300 to 20,000 nanoamps, most preferably from 1500 to 5,000 nanoamps. As is well known, a higher current ion beam results in an increased sputter rate. The higher beam current of a noble gas column makes it possible to achieve the desired throughput requirements for mass production. The beam current that should be used will depend upon the material being milled and the level of accuracy required. For example, where overmilling is not an issue and endpointing is not critical, higher beam currents can be used.

One disadvantage of a higher beam current is, of course, a larger beam diameter. The typical alignment mark box is around 100 microns wide, some as large as 500 µm to 800 µm. Using an advanced argon column with a beam current of 5,000 nanoamps, the beam diameter may still be less than 50 µm.

Various types of plasma sources are known and could be used to practice the invention, including Electron Cyclotron Resonance (ECR) sources in which the plasma is generated by resonantly coupling microwave energy into the ion source; Penning type sources in which the plasma is generated by striking a direct current discharge between a suitably shaped anode and cathode; direct current (DC) driven volume sources in which an electric arc is struck between heated filaments and an anode; and radio frequency (RF) driven volume sources in which radio frequency energy is coupled to the gas in the ion source by a suitably configured antenna.

Depending upon the desired ion species, the appropriate gas (such as argon, krypton, or xenon) is stored in gas storage tank 312 and introduced into plasma ion source 310 through leak valve 313. In conjunction with a vacuum gauge near the column on the vacuum pump side (not shown) Leak Valve 313 can be operated manually or computer controlled via leak valve controller 350, which allows gas flow to be precisely controlled. This gas is then ionized by an appropriate energy source. Depending upon the type of ion source used, plasma ion source 310 can be evacuated by turbomolecular pump 314 backed by a dry roughing pump (or a configuration with similar performance).

Ions are then extracted and accelerated down through ion column 308 by the column optics (not shown). Ion column 308 is evacuated by turbomolecular pump 316, which is backed by roughing pump 317. Ion column 308 is typically maintained at a pressure of less than $1 \times 10^{-6}$ mbar in order to maintain a gas flow appropriate for the column.

In a preferred embodiment, stage 301 is a tiltable stage that can be inclined at any desired angle. Stage tilt and position can be controlled via stage controller 348. A tiltable stage allows ion beam 322 to be directed at workpiece 302 at an oblique angle relative to the sample surface, which results in a higher sputter rate and increased throughput. Skilled persons will recognize that milling rate (also referred to as sputter rate) typically increases with the beam angle of incidence up to a certain angle, then decreases. Although sputter rate is material dependent, typically the sputter rate is maximized where the angle of the ion beam relative to the sample surface is between 40° and 80°. The optimum tilt is dependent upon the material being milled and upon the sputter rate desired. For example, where endpointing is critical a lower sputter rate might be advantageous and a higher beam angle could be used. Alternatively, the ion column can be tilted instead of the stage.

Figure 4:
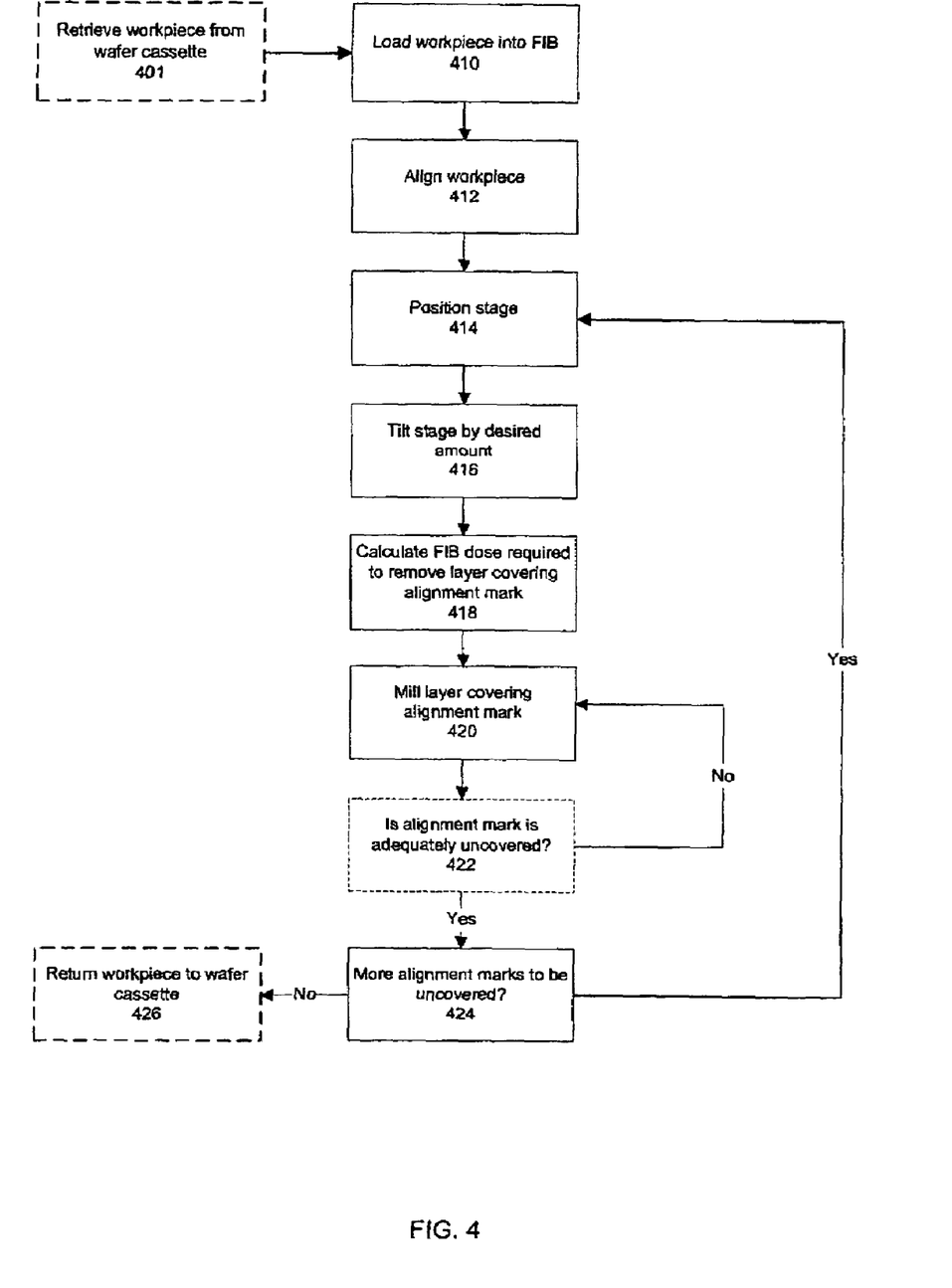
FIG. 4 is a flowchart showing the steps of a preferred embodiment of the invention.

FIG. 4 is a flowchart showing the steps of a preferred embodiment of the invention. In optional step 402401, a workpiece, such as a semiconductor wafer where the alignment marks have been covered by a metallization layer, is retrieved from a cassette containing a number (e.g. 25 units) of wafers.

In step 410, a workpiece is loaded into a particle beam system, such as a focused ion beam, by mounting the workpiece on the FIB stage. The workpiece can be loaded manually or automatically, for example by an automatic handler system.

In step 412, the workpiece is aligned. This alignment can also be accomplished manually, for example by an operator using an optical microscope, or automatically, for example by using an automatic handler robot which locates a notch or flat edge of the wafer in order to determine the proper orientation.

In step 414, the stage is positioned so that the metallization layer covering an alignment mark is within the area scanned by the charged particle beam. This positioning can be accomplished, for example, by storing and using positional coordinates for each alignment mark to be uncovered.

In step 416, the stage is tilted to the desired angle. As discussed above, an oblique angle between the charged particle beam and the sample surface increases the milling rate.

In step 418, the appropriate beam dose required to remove the metallization layer covering the workpiece is calculated. Methods of calculating beam dose are well known. For example, a test layer of the same material and thickness could be experimentally milled and measured to determine the milling rate at a given beam current. The beam current and the dose required to mill away the test layer could be stored and used to mill the layer over the alignment marks on each workpiece. Because the milling rate is dependent upon the angle of incidence between a charged particle beam and a sample surface, the calculation of beam dose must take stage angle into account.

In step 420, the appropriate beam dose is applied to mill the metallization layer and uncover the alignment mark. In optional step 422, adequate removal of the metallization layer is confirmed, for example by inspection with an optical microscope.

In step 424, the system determines whether any additional alignment marks on the workpiece need to be uncovered. If so, the coordinates for the next alignment mark are retrieved by the system and the process returns to step 414. The process continues until there are no further alignment marks to be uncovered.

In optional step 426, the completed workpiece is returned to the cassette and the next workpiece is retrieved. Once each workpiece in the cassette has been processed, the cassette is returned to the manufacturing track.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A method for removing a material covering an alignment mark on a substrate, comprising:
    mounting the substrate onto a stage in a focused ion beam system, said focused ion beam system having a non-liquid metal ion source;
    directing an ion beam at the material covering an alignment mark, said ion beam having a beam current greater than 300 nanoamps and directed at an oblique angle relative to the surface of the substrate; and
    removing said material by ion beam sputtering, said ion beam maintaining a substantially identical oblique angle relative to the surface of the substrate while material is removed by ion beam sputtering.

2. The method of claim 1 in which the focused ion beam system has a plasma ion source.

3. The method of claim 1 in which the ion beam is directed at an angle less than 80° relative to the substrate surface normal.

4. A method for removing a material covering an alignment mark on a substrate, comprising:
    directing a focused ion beam of noble gas ions at the material covering an alignment mark;
    said focused ion beam being directed at the substrate at an angle of between 40° and 80° relative to the substrate surface normal; and
    removing said material by charged particle beam sputtering without using an etch assisting gas.

5. The method of claim 4 in which said focused ion beam is selected from the group consisting of an argon ion beam, a krypton ion beam, and a xenon ion beam.

6. The method of claim 4 in which the charged particle beam has a beam current of 300 nanoamps to 20,000 nanoamps.

7. The method of claim 4 in which the charged particle beam has a beam current of 1500 nanoamps to 5000 nanoamps.

8. The method of claim 4 in which the substrate is a silicon wafer.

9. The method of claim 4 in which the material covering an alignment mark is a metal film.

10. The method of claim 4 in which said focused ion beam is an argon ion beam.

11. An apparatus for removing a material covering an alignment mark on a substrate, comprising:
    a device to load the substrate;
    a device to align the substrate;
    a device to position the substrate;
    a noble gas ion beam system having a noble gas ion source suitable for emitting a noble gas ion beam, said source oriented at an oblique angle relative to the substrate surface normal, an optical system to focus the noble gas ion beam, and a computer controlled beam deflector to position the noble gas ion beam;
    a device for controlling the charged particle beam dose applied to said material;
    computer accessible memory in communication with said device to position the substrate and said device to control the charged particle beam dose applied to said material, the memory storing computer instructions for:
        (i) directing a charged particle beam at material covering an alignment mark; and
        (ii) removing said material by charged particle beam sputtering; and
    a device to unload the substrate.

12. The apparatus of claim 11 in which the charged particle beam system is selected from the group consisting of an argon ion beam system, a krypton ion beam system, and a xenon ion beam system.

13. The apparatus of claim 11 in which the charged particle beam is directed at an angle of between 40° and 80° relative to the substrate surface normal.

14. The apparatus of claim 11 in which the charged particle beam has a beam current of 300 nanoamps to 20,000 nanoamps.

15. The apparatus of claim 11 in which the charged particle beam has a beam current of 1500 nanoamps to 5000 nanoamps.

16. The apparatus of claim 11 in which the device for aligning the substrate comprises an optical microscope.

17. A method for removing a material covering an alignment mark on a substrate, comprising:
- mounting the substrate onto a stage in a focused ion beam system, said focused ion beam system having an ion column with an optical axis and a non-liquid metal ion source;
- directing an ion beam at the material covering an alignment mark, said ion beam having a beam current greater than 300 nanoamps and said optical axis forming an oblique angle relative to the substrate surface normal; and
- removing said material by ion beam sputtering without using an etch assisting gas.

18. The method of claim 17 in which the charged particle beam has a beam current of 300 nanoamps to 20,000 nanoamps.

19. The method of claim 17 in which the charged particle beam has a beam current of 1500 nanoamps to 5000 nanoamps.

20. The method of claim 17 in which the substrate is a silicon wafer.

21. The method of claim 17 in which the material covering an alignment mark is a metal film.

22. The method of claim 17 in which said focused ion beam is an argon ion beam.

* * * * *

UNITED STATES PATENT AND TRADEMARK OFFICE
CERTIFICATE OF CORRECTION

| | |
|---|---|
| PATENT NO. | : 7,150,811 B2 |
| APPLICATION NO. | : 10/669616 |
| DATED | : December 19, 2006 |
| INVENTOR(S) | : Brian Miller |

It is certified that error appears in the above-identified patent and that said Letters Patent is hereby corrected as shown below:

On Title Page (73), change "Assignee: PEI Company" to read "Assignee: FEI Company";

Column 5, Line 8 – change "can loaded" to read "can be loaded";

Column 6, Line 46 – change "402401" to read "401";

Signed and Sealed this
Nineteenth Day of March, 2013

Teresa Stanek Rea
*Acting Director of the United States Patent and Trademark Office*